United States Patent [19]

Tsuchiya et al.

[11] Patent Number: 4,938,789
[45] Date of Patent: Jul. 3, 1990

[54] RAW MATERIAL SUPPLYING DEVICE AND PROCESS

[75] Inventors: Ichiro Tsuchiya; Hiroshi Yokota; Toshio Danzuka; Hideki Minami, all of Kanagawa, Japan

[73] Assignee: Sumitomo Electric Industries, Ltd., Osaka, Japan

[21] Appl. No.: 205,030

[22] Filed: Jun. 7, 1988

Related U.S. Application Data

[63] Continuation of Ser. No. 854,638, Apr. 22, 1986, abandoned.

[30] Foreign Application Priority Data

May 1, 1985 [JP] Japan ................. 60-92272

[51] Int. Cl.$^5$ ............................................ C03B 37/00
[52] U.S. Cl. .................................. 65/144; 65/3.12; 65/11.1; 65/18.2; 65/1; 65/157; 65/160; 118/692; 118/715; 137/86; 137/90; 137/115; 137/207
[58] Field of Search ............... 65/2, 3.12, 3.3, 18.2, 65/144, 157, 160, 1, 11.1; 137/86, 90, 115, 207; 118/692, 715

[56] References Cited

U.S. PATENT DOCUMENTS

| | | | |
|---|---|---|---|
| 4,230,744 | 10/1980 | Blankenship | 65/3.12 |
| 4,234,314 | 11/1980 | Jones | 422/110 |
| 4,280,829 | 7/1981 | Sheth | 65/3.12 |
| 4,302,217 | 11/1981 | Teitel | 422/110 |
| 4,314,837 | 2/1982 | Blankenship | 65/3.12 |
| 4,378,985 | 4/1983 | Powers | 65/3.2 |
| 4,545,801 | 10/1985 | Miyajiri et al. | 65/157 |
| 4,568,370 | 2/1986 | Powers | 65/3.11 |
| 4,599,098 | 7/1986 | Sarkar | 65/3.12 |
| 4,661,140 | 4/1987 | Takimoto et al. | 65/157 |
| 4,718,929 | 1/1988 | Power et al. | 65/3.12 |
| 4,753,787 | 6/1988 | Krijgsman | 422/110 |
| 4,767,429 | 8/1988 | Fleming | 65/3.11 |

OTHER PUBLICATIONS

G. D. Ulrich, "A Guide to Chemical Engineering Process Design and Economics", 1984, pp. 244–249.

Primary Examiner—Kenneth M. Schor
Assistant Examiner—Lori Ann Johnson
Attorney, Agent, or Firm—Sughrue, Mion, Zinn, Macpeak & Seas

[57] ABSTRACT

A raw material supplying device having a gas tight tank for receiving a material to be gasified by heating; a heater for heating the raw material within the tank and a plurality of pipes for conveying a plurality of streams of gas in parallel to each other to a plurality of ports of a reaction apparatus, and a process for using the raw material supplying device. The raw material supplying device can be used in a system for manufacturing glass fibers in which the ends of the plurality of pipes are connected to the gas feed ports of at least one multilayer burner.

4 Claims, 4 Drawing Sheets

RAW MATERIAL SUPPLYING DEVICE AND PROCESS

This is a continuation of application Ser. No. 854,638 filed Apr. 22, 1986, now abandoned.

BACKGROUND OF THE INVENTION

1. Field of the Invention

This invention relates to a raw material supplying device for accurately and stably supplying gas materials such as $SiCl_4$ or $GeCl_4$, by controlling the flow rate thereof. The invention can be used in the manufacturing of optical fiber preforms or semiconductor pipes. Also, this invention includes a process for accurately and stably supplying gas material in the manufacturing of optical fibers and semiconductor pipes.

2. Description of the Prior Art

A raw material supplying device for manufacturing optical fiber preforms will be described. A VAD method, OVD method or MCVD method has been known as an optical fiber base material manufacturing method. In the VAD method requiring the continuous supply of gas material for a long period of time, the gas material is formed by gasifying the liquid glass material, and is supplied, under a pressure higher than the atmospheric pressure, to a single or a plurality of multi-layer burners provided for the reaction vessel, so that it is burnt to form a glass powder which is accumulated on the rotating seed rod, thus providing a bar-shaped porous base material (soot boule). The soot boule is dehydrated and consolidated into the preform then spun into an optical fiber. For this purpose, it is necessary to provide a raw material supplying device which can continuously and stably supply a large mount of gas material to the reaction vessel. Also, in the OVD method or MCVD method, a raw material supplying device for continuously supplying gas material to the reaction vessel or quartz pipe is employed. Furthermore, in the forming of semiconductors, a raw material supplying device of this type is employed to supply gas material from a liquid under a pressure higher or lower than the atmospheric pressure.

One example of a known raw material supplying device is shown in FIG. 6. In the raw material supplying device, a liquid material 2 which reacts with the oxygen gas or moisture in the air is placed in a gas-tight raw material tank, and a heater 3 is provided around the raw material tank 1 to gasify the liquid raw material 2. The upper space 4 in the raw material tank 1 is filled with the gas material which is produced by gasification of the li-quid raw material, under the vapor pressure of the raw material determined by the temperature of the raw material tank 1.

A pipe 5 is connected between the upper space 4 of the raw material tank 1 and a reaction vessel (not shown), to supply the gas material to the reaction vessel. The pipe 5 is provided with a valve 6, an automatic valve 7, and a flow control unit 8. A mass flow controller is extensively employed as the flow control unit 8. A pipe 9 with an automatic valve 10 is connected to the pipe 5 between the automatic valve 7 and the flow control unit, to supply nitrogen gas. The automatic valve 10 is operated in association with the automatic valve 7 in such a manner that, when the raw material is being supplied, the automatic valve 7 is open while the automatic valve 10 is closed so that the raw material is sent to the reaction vessel, and, when the raw material is not supplied, the automatic valve 7 is closed while the automatic valve 10 is open so that nitrogen gas is fed into the pipe for protection of the pipe.

With the raw material supplying device of FIG. 6, the gas material is sent into the reaction vessel as follows: When the raw material is not supplied to the reaction vessel, the automatic valve 7 is closed while the automatic valve 10 is open, so that the part of the pipe 5, which is on the reaction vessel side, is purged by the nitrogen gas. In order to start supplying of the raw material, the heater 3 is energized so that the liquid material in the raw material tank 1 is heated and the gas pressure in the upper space 4 of the raw material tank 1 reaches a predetermined value higher than the atmospheric pressure. For instance in the case where the liquid material is $SiCl_4$ and it is required to increase the gas pressure to about 1 $kg/cm^2$, heating is carried out until the temperature in the raw material tank reaches 80° C. Under this condition, the automatic valve 10 is closed and the automatic valve 7 is opened, to send the gas material to the reaction vessel. In this operation, the flow control unit 8 operates to control the flow rate of the gas material to a suitable value.

After the supplying of the gas material is completed, the automatic valve 7 is closed and the automatic valve 10 is opened so that the pipe 5 is purged by the nitrogen gas. Of course, where the gas material will not be needed for a time, the heater is deenergized so that the raw material 1 cools down.

Problems arise in the manufacture of optical fibers and semiconductor pipes where the same gas material needs to be supplied to different gas ports at different flow rates or at different times, for example, in the VAD method of manufacturing an optical fiber preform, sometimes a plurality of multi-layer burners is included in one reaction vessel, and it is sometimes required to send the same raw material to the multi-layer burners respectively in different flow rates or with different timing. Furthermore, sometimes it is required that the same raw material is supplied to the ports of one multi-layer burner at flow rates which differ from port to port.

An optical fiber soot boule manufacturing device is shown in FIG. 7 in which the raw material supplying device as shown in FIG. 6 is provided for each port of each of the multi-layer burners. Accordingly, the manufacturing device is unavoidably expensive, with the result that the manufacturing cost is high. In FIG. 7, those parts which have been described with reference to FIG. 6 are designated by the same reference numerals. In the operation of the manufacturing device of FIG. 7, burners $11_1$, $11_2$ and $11_3$ can be separate burners or different ports of a multi-layer burner. In reaction vessel 12, seed rod 14 is rotated, as is known to form a porous glass base material (soot boule), which is gradually pulled upwardly to gradually form optical fiber soot boule 13.

In the case where, in an optical fiber preform manufacturing method, such as the OVD method, MCVD method or VAD method, a plurality of manufacturing devices are operated in a parallel mode, although the same gaseous material is supplied to only one port of each reaction vessel or quartz pipe, it is necessary to use as many of the raw material supplying devices of FIG. 6 for the single gaseous material as there are manufacturing devices, which results in an increase of the manufacturing cost.

Especially in the OVD method, similarly as in the VAD method, sometimes it is necessary to provide the same raw material to one or more ports of each of a plurality of multi-layer burners for one reaction vessel, or to supply the same raw material to the different ports of one multi-layer burner. In these cases, it is necessary to provide a number of raw material supplying devices as shown in FIG. 6, for the same raw material, and therefore the manufacturing apparatus is necessarily expensive.

In view of the foregoing, an object of this invention is to provide a raw material supplying device which is capable of accurately and stably supplying a gas which is used as a raw material for manufacturing an optical fiber preform or a semiconductor from a raw material tank to a plurality of gas burners provided for a reaction vessel or to the ports of a multi-layer burner, in a manner allowing control of the flow rate to each of the gas burners or to each port of a multi-layer burner.

Other objects of the invention will be apparent to the skilled artisan from the detailed description of the invention hereinbelow.

SUMMARY OF THE INVENTION

The foregoing object and other objects of the invention have been achieved by the provision of a raw material supplying device comprising: a gas-tight raw material tank for receiving a liquid material which reacts with the oxygen or moisture in the air; heating means for heating the liquid material in the raw material tank to gasify the liquid material to form a gas material; piping for supplying the gas material to a reaction apparatus; and valves and flow control units provided for the piping; in which, according to the invention, the piping comprises a plurality of pipes, and each of the pipes is provided with a valve and a flow control unit. By this apparatus, a plurality of streams of the same gas can be provided in parallel fashion, with individual control of each stream, to a plurality of gas feed ports in an optical fiber or semiconductor pipe manufacturing system.

In preferred embodiments of the present invention, a pressure absorbing means is provided between the tank and the flow control units so that an abrupt change of gas flow rate in anyone of the plurality of pipes does not effect the gas flow rates in the remaining pipes. As an illustration of the pressure absorbing means, a gas pool, having different configurations as illustrated in the drawing, is used.

The objects of the present invention are also achieved by providing a process for feeding a raw material gas formed from a liquid material which reacts with oxygen or moisture to a plurality of gas feed ports of a reaction apparatus by conveying the gas in a plurality of parallel streams to a plurality of gas inlet ports of said reaction apparatus, with regulating the flow rate of each of the streams of gas by using a valve and a gas flow rate control unit.

DETAIL DESCRIPTION OF THE INVENTION

Preferred embodiments of the invention will be described with reference to the accompanying drawings.

Figure 1:
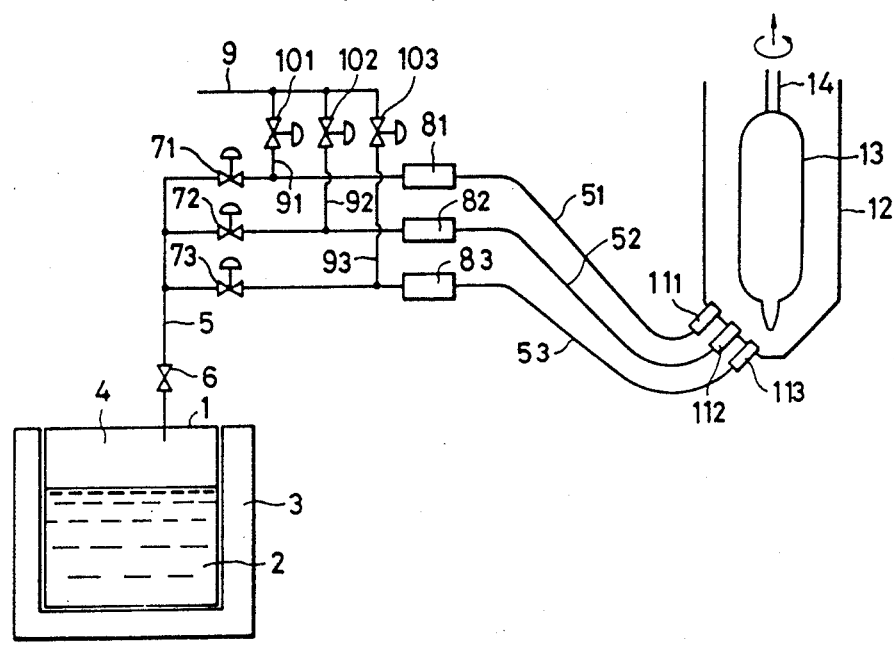
FIGS. 1–5 are explanatory schematic diagrams illustrating various embodiments of a raw material supplying device in accordance with the present invention, in combination with an optical fiber manufacturing device.

FIG. 1 is an explanatory diagram showing the arrangement of a first example of a raw material supplying device according to the invention. As shown in FIG. 1, a liquid material 2 such as $SiCl_4$ or $GeCl_4$ is stored in a gas-tight raw material tank 1. The tank 1 is heated by a heater 3, as a result of which the liquid material 2 is partially gasified, and the upper space 4 of the tank 1 is filled with the gas under the vapor pressure corresponding to the temperature of the raw material tank 1. The gas in the upper space 4 (hereinafter referred to as "a gas material", when applicable) is sent through a pipe 5 extended through a valve 6 and through branch pipes $5_1$, $5_2$ and $5_3$ extended from the pipe 5 respectively to the ports of burners $11_1$, $11_2$ and $11_3$ provided for a reaction vessel 12 which is operated according to the VAD method.

The branch pipes $5_1$, $5_2$ and $5_3$ are provided with automatic (or manual) valves $7_1$, $7_2$ and $7_3$, and flow control units $8_1$, $8_2$ and $8_3$, respectively, as shown in FIG. 1. On the other hand, branch pipes $9_1$, $9_2$ and $9_3$ are extended from a pipe 9 for supplying a pipe purging nitrogen gas. The branch pipes, $9_1$, $9_2$ and $9_3$ are connected through automatic (or manual) valves $10_1$, $10_2$ and $10_3$ to the parts of the branch pipes $5_1$, $5_2$ and $5_3$, respectively, which are located between the flow control units $8_1$, $8_2$ and $8_3$ and the automatic valves $7_1$, $7_2$ and $7_3$, respectively.

In the raw material supplying device of FIG. 1, the automatic valves $10_1$, $10_2$ and $10_3$ are operated in association with the automatic values $7_1$, $7_2$ and $7_3$. That is, when the raw material is supplied to the reaction vessel 12, the automatic valves $7_1$, $7_2$ and $7_3$ are opened while the automatic valves $10_1$, $10_2$ and $10_3$ are closed so that the gas material is supplied through the ports of burners $11_1$ through $11_3$ to the reaction vessel 12; and when the raw material is not being supplied to the reaction vessel 12, the automatic valves $7_1$ through $7_3$ are closed while the automatic valves $10_1$ through $10_3$ are opened to send nitrogen gas into the pipes $5_1$, $5_2$ and $5_3$, thereby to purge the branch pipes. The gas material is supplied to the burners $11_1$, $11_2$ and $11_3$ at predetermined flow rates, respectively, by means of the flow control units $8_1$, $8_2$ and $8_3$. The burners $11_1$, $11_2$ and $11_3$ may be ones independent of one another or the ports of a multi-layer burner. $H_2$, $O_2$, seal gas and the other raw material gas are provided to the other ports of the burner or burners The burners $11_1$ through $11_3$ and the reaction vessel 12 including the start material 14 form a reaction apparatus.

The gas material thus supplied reacts in the $H_2/O_2$ flame and becomes glass powders which are deposited to the seed rod 14 which is rotated in the reaction vessel 12, thus forming a porous glass base material (soot boule). The soot boule is gradually pulled upwardly, so that an optical fiber soot boule 13 is gradually formed. The soot boule is then dehydrated and consolidated in the following process and the optical fiber preform is provided.

Figure 2:
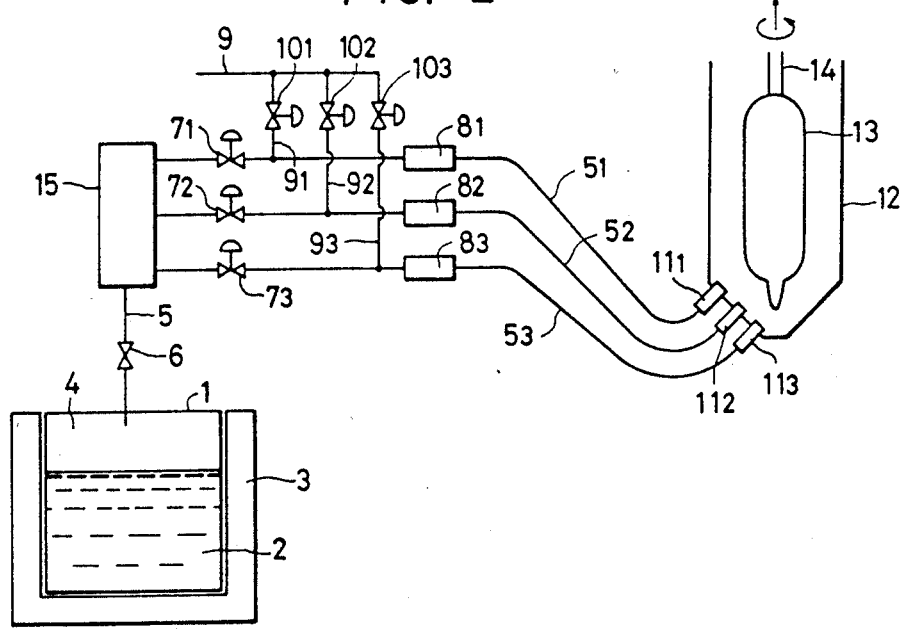

FIG. 2 shows the arrangement of a second example of the raw material supplying device according to the invention. In the device of FIG. 1, the pipe 5 extends through the valve 6 from the raw material tank 1, and the pipe 5 branches directly into the branch pipes $5_1$, $5_2$ and $5_3$. On the other hand, in the device of FIG. 2, the pipe 5 extends through the valve 6 from the raw material tank 1 and then leads into a pressure absorbing means, namely, a gas pool 15, and the branch pipes are connected with the gas pool 15.

In the device of FIG. 1, the base parts of the branch pipes $5_1$ through $5_3$ are connected directly to the main pipe 5 which is equal in diameter to the branch pipes. Therefore, the device suffers from a difficulty that, if the flow rate of the gas is abruptly changed in any one of the branch pipes when one of the automatic valves is abruptly opened or closed or when one of the flow control units operates abruptly, the flow control units of the other branch pipes cannot operate accurately. In order to allow the flow control units $8_1$ through $8_3$ to perform their flow control operations accurately, the difference between the primary pressure and the secondary pressure should be of the order of 0.5 to 1.0 $kg/cm^2G$. On the other hand, the heat resisting characteristics of the components such as the pipes limit increasing of the temperature of the raw material tank 1. Accordingly, the primary pressure cannot be increased so high, and therefore the flow control units are used with a relatively low pressure difference. Furthermore, the flow control unit can respond to a gradual pressure change, but cannot quickly respond to an abrupt pressure change. Therefore, in the device of FIG. 1, when the flow rate is abruptly changed in one of the branch pipes $5_1$ through $5_3$, the flow rates in the other branch pipes are affected.

In the raw material supplying device of FIG. 2, the branch pipes $5_1$ through $5_3$ originate from the gas pool 15. Therefore, when the flow rate in one of the branch pipes is abruptly changed, the flow rates in the other branch pipes are not affected thereby. Accordingly, in the device of FIG. 2, the flow control units of the branch pipes can accurately and stably control the flow rates therein. In FIG. 2, those parts which have been described with reference to FIG. 1 are designated by the same reference numerals.

Figure 3:
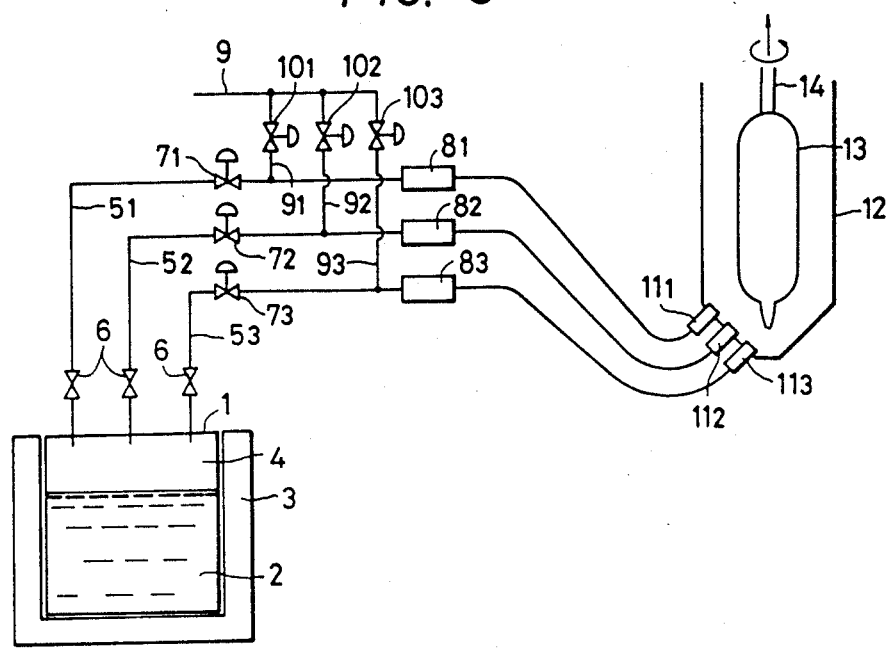

A third example of the raw material supplying device according to the invention is as shown in FIG. 3. In this device, a plurality of pipes $5_1$, $5_2$ and $5_3$ extend directly from a raw material tank 1, and the upper space 4 of the raw material tank 1 is used as pressure absorbing means. In FIG. 3, those components which have been already described with reference to FIG. 1 are designated by the same reference numerals.

Figure 4:
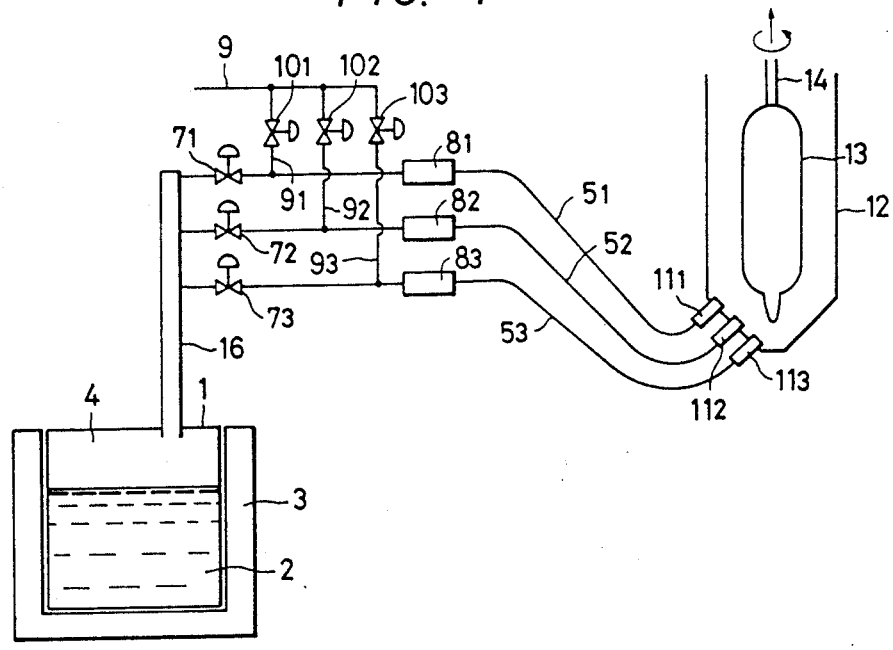

FIG. 4 shows the arrangement of a fourth example of the raw material supplying device according to the invention. In the fourth example, a main pipe 16 originating from a raw material tank 1 serves as a gas pool (hereinafter referred to as "a gas pool main pipe 16", when applicable). Therefore, the gas pool main pipe 16 forms the aforementioned pressure absorbing means. The cross-sectional area of the gas pool main pipe 16 is larger than the sum of the cross-sectional areas of branch pipes $5_1$, $5_2$ and $5_3$ which extend from the gas pool main pipe 16. The remainder of the device of FIG. 4 is the same as that of the device of FIG. 1. In FIG. 4, those components which have previously been described with reference to FIG. 1 are designated by the same reference numerals.

Figure 5:
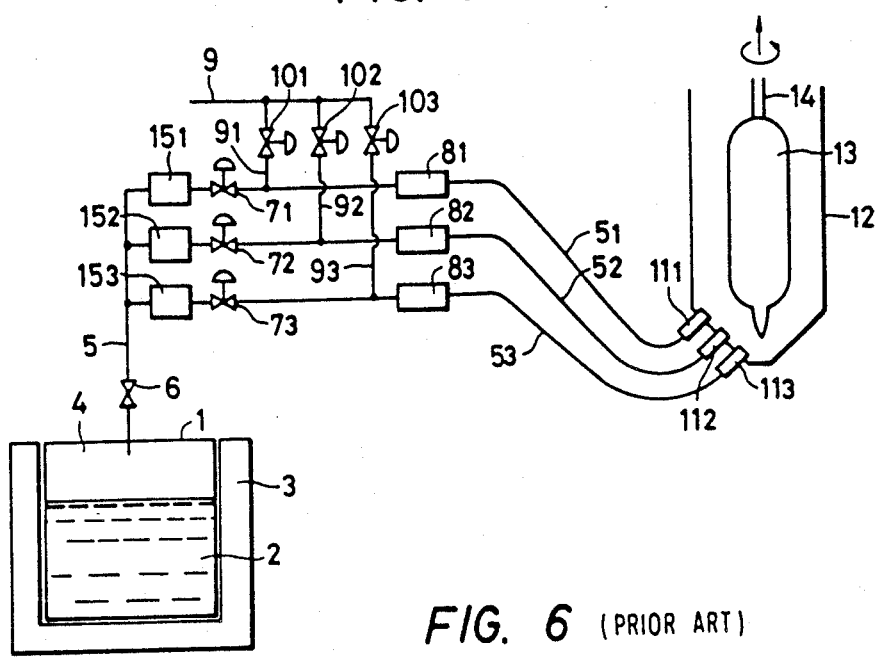
Figure 6:
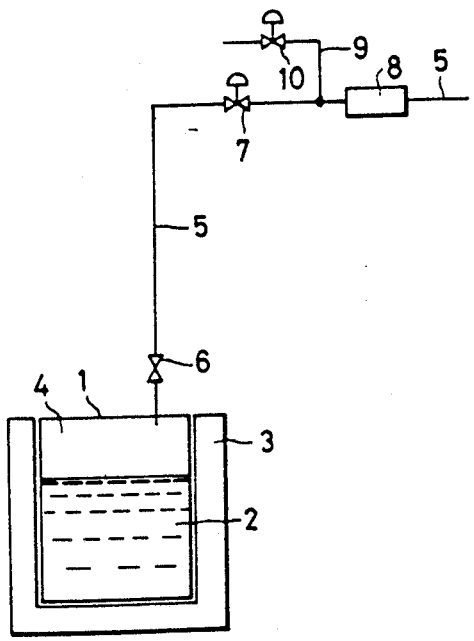
FIGS. 6 and 7 explanatory schematic diagrams illustrating respectively a conventional raw material supplying device and the use of such a device with an optical fiber manufacturing device.
Figure 7:
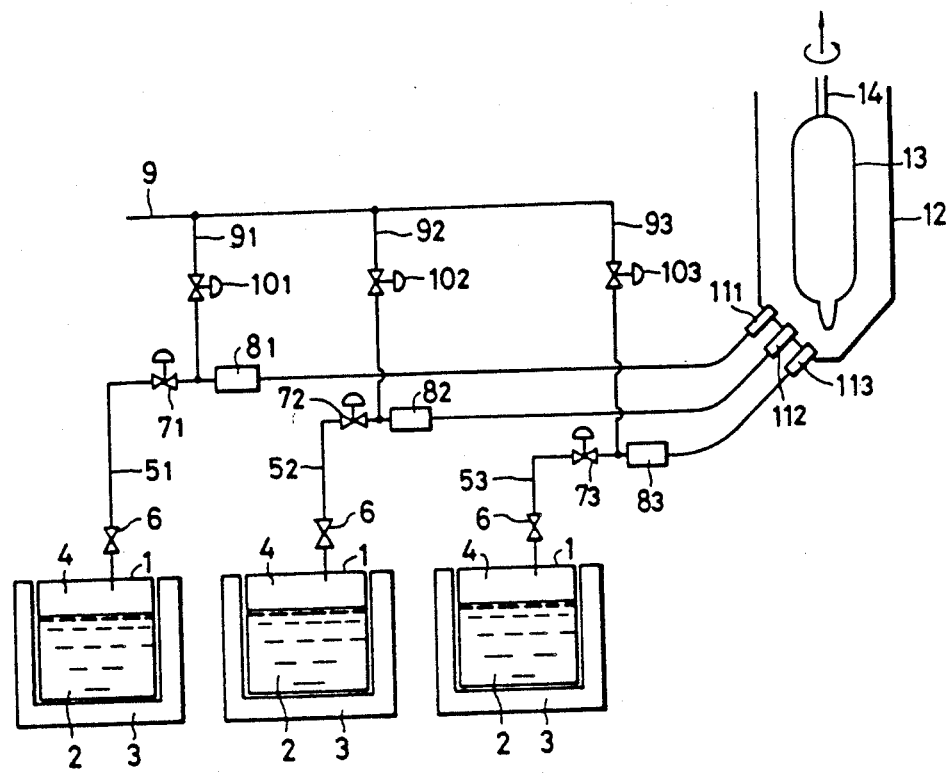

FIG. 5 shows the arrangement of a fifth example of the raw material supplying device according to the invention. In the device of FIG. 5, branch pipes $5_1$, $5_2$ and $5_3$ are extended respectively through gas pools $15_1$, $15_2$ and $15_3$ from a main pipe 5 so that the abrupt change of the flow rate in any one of the branch pipes may not affect the flow rates of the remaining branch pipes. In FIG. 5, those components which have been already described with reference to FIG. 1 are designated by the same reference numerals.

In the raw material supplying device according to the invention, the gas material in one raw material tank is supplied to a plurality of ports of burners provide for the reaction vessel or a plurality of ports of a multi-layer burner through a plurality of pipes equipped with automatic valves and flow control units. Therefore, the gas material can be supplied to the respective ports of burners or ports of a burner under indivisual predetermined flow rates. The raw material supplying device of the invention is relatively small in size and can run at relatively low cost, with the result that the product manufacturing cost is decreased.

In the raw material supplying device having pressure absorbing means interposed between the raw material tank and the branch pipes, the abrupt change of the flow rate in any one of the branch pipes does not affect the flow rates of the remaining branch pipes. Thus, the gas material can be accurately and stably fed to the burners through the pipes.

Variations of the invention will be apparent to the skilled artisan.

We claim:

1. In the raw material supplying system for manufacturing optical fiber preforms under atmospheric pressure or higher pressure than atmospheric pressure comprising (A) at least one reaction vessel with at least one multi-layer burner mounted on said at least one reaction vessel, each of said burner layers including a separate raw material gas feed port, (B) a gas tight raw material tank for receiving a high-boiling raw material to be gasified by heating, (C) heating means for heating the raw material in the tank to form said raw material gas therefrom and (D) piping means connected to said tank and said gas feed ports to convey said raw material gas to said gas feed ports, the improvement comprising said piping means comprising a plurality of pipes for conveying a plurality of streams of said gas in parallel to each other to the ports of said reaction vessel, each of said pipes including a valve and a mass flow controller, said mass flow controller being positioned between said value and said reaction vessel, with each pipe of said plurality of pipes being connected to a different one of said ports, and pressure absorbing means being positioned between said tank and said mass flow controllers, respectively, wherein an abrupt change of mass flow rate in any one of said plurality of pipes does not affect the mass flow rates in the remaining pipes of said plurality of pipes.

2. The system of claim 1 wherein said pressure absorbing means is a gas pool.

3. The system of claim 2 wherein said gas pool is positioned between said tank and said plurality of pipes.

4. The apparatus of claim 1 wherein said pressure absorbing means comprises a plurality of gas pools, each of said gas pools being associated with a different one of said pipes forming said plurality of pipes.

* * * * *